United States Patent
Choi et al.

(10) Patent No.: US 7,265,416 B2
(45) Date of Patent: Sep. 4, 2007

(54) HIGH BREAKDOWN VOLTAGE LOW ON-RESISTANCE LATERAL DMOS TRANSISTOR

(75) Inventors: Yong-cheol Choi, Siheung (KR);
Chang-ki Jeon, Kimpo (KR);
Cheol-joong Kim, Boocheon (KR)

(73) Assignee: Fairchild Korea Semiconductor Ltd., Kyungki-do (KR)

( * ) Notice: Subject to any disclaimer, the term of this patent is extended or adjusted under 35 U.S.C. 154(b) by 0 days.

(21) Appl. No.: 10/366,545

(22) Filed: Feb. 12, 2003

(65) Prior Publication Data
US 2003/0173624 A1  Sep. 18, 2003

(30) Foreign Application Priority Data
Feb. 23, 2002  (KR) .................... 10-2002-0009731

(51) Int. Cl.
*H01L 29/94* (2006.01)
*H01L 29/76* (2006.01)

(52) U.S. Cl. ............... 257/343; 257/345; 257/E29.263; 438/282

(58) Field of Classification Search ................ 257/345, 257/343, E29.263; 438/282
See application file for complete search history.

(56) References Cited

U.S. PATENT DOCUMENTS

| | | | |
|---|---|---|---|
| 3,404,295 A | 10/1968 | Warner et al. | |
| 3,412,297 A | 11/1968 | Amlinger | |
| 3,497,777 A | 2/1970 | Teszner et al. | |
| 3,564,356 A | 2/1971 | Wilson | |
| 3,660,697 A | 5/1972 | Berglund et al. | |

(Continued)

FOREIGN PATENT DOCUMENTS

| | | |
|---|---|---|
| CN | 1036666 A | 10/1989 |
| DE | 4300806 C1 | 12/1993 |
| DE | 19736981 A1 | 8/1998 |
| EP | 0975024 A2 | 1/2000 |
| EP | 1026749 A1 | 8/2000 |

(Continued)

OTHER PUBLICATIONS

Bai et al., "Novel automated optimization of power MOSFET for 12V input, high-frequency DC—DC converter," *International Symposium on Power Semiconductors and ICs, Technical Digest*, (2003), pp. 366-369.

(Continued)

*Primary Examiner*—Kenneth Parker
*Assistant Examiner*—Joseph Nguyen
(74) *Attorney, Agent, or Firm*—Townsend and Townsend and Crew LLP (57) ABSTRACT

In accordance with the present invention, a metal oxide semiconductor (MOS) transistor has a substrate of a first conductivity type. A drift region of a second conductivity type extends over the substrate. A body region of the first conductivity type is in the drift region. A source region of the second conductivity is in the body region. A gate extends over a surface portion of the body region. The surface portion of the body region extends between the source region and the drift region to form a channel region of the transistor. A drain region of the second conductivity type is in the drift region. The drain region is laterally spaced from the body region. A first buried layer of the second conductivity type is between the substrate and drift region. The first buried layer laterally extends from under the body region to under the drain region. A second buried layer of the first conductivity type is between the first buried layer and the drift region. The second buried layer laterally extends from under the body region to under the drain region.

19 Claims, 9 Drawing Sheets

U.S. PATENT DOCUMENTS

| | | |
|---|---|---|
| 4,003,072 A | 1/1977 | Matsushita et al. |
| 4,011,105 A | 3/1977 | Paivinen et al. |
| 4,300,150 A | 11/1981 | Colak |
| 4,324,038 A | 4/1982 | Chang et al. |
| 4,326,332 A | 4/1982 | Kenney et al. |
| 4,337,474 A | 6/1982 | Yukimoto |
| 4,345,265 A | 8/1982 | Blanchard |
| 4,445,202 A | 4/1984 | Geotze et al. |
| 4,568,958 A | 2/1986 | Baliga |
| 4,579,621 A | 4/1986 | Hine |
| 4,636,281 A | 1/1987 | Buiguez et al. |
| 4,638,344 A | 1/1987 | Cardwell, Jr. |
| 4,639,761 A | 1/1987 | Singer et al. |
| 4,673,962 A | 6/1987 | Chatterjee et al. |
| 4,698,653 A | 10/1987 | Cardwell, Jr. |
| 4,716,126 A | 12/1987 | Cogan |
| 4,745,079 A | 5/1988 | Pfiester |
| 4,746,630 A | 5/1988 | Hui et al. |
| 4,754,310 A | 6/1988 | Coe |
| 4,767,722 A | 8/1988 | Blanchard |
| 4,774,556 A | 9/1988 | Fujii et al. |
| 4,801,986 A | 1/1989 | Chang et al. |
| 4,821,095 A | 4/1989 | Temple |
| 4,823,176 A | 4/1989 | Baliga et al. |
| 4,824,793 A | 4/1989 | Richardson et al. |
| 4,853,345 A | 8/1989 | Himelick |
| 4,868,624 A | 9/1989 | Grung et al. |
| 4,893,160 A | 1/1990 | Blanchard |
| 4,914,058 A | 4/1990 | Blanchard |
| 4,941,026 A | 7/1990 | Temple |
| 4,961,100 A | 10/1990 | Baliga et al. |
| 4,967,245 A | 10/1990 | Cogan et al. |
| 4,969,028 A | 11/1990 | Baliga |
| 4,974,059 A | 11/1990 | Kinzer |
| 4,990,463 A | 2/1991 | Mori |
| 4,992,390 A | 2/1991 | Chang |
| 5,027,180 A | 6/1991 | Nishizawa et al. |
| 5,034,785 A | 7/1991 | Blanchard |
| 5,065,273 A | 11/1991 | Rajeevakumar |
| 5,071,782 A | 12/1991 | Mori |
| 5,072,266 A | 12/1991 | Buluccea |
| 5,079,608 A | 1/1992 | Wodarczyk et al. |
| 5,105,243 A | 4/1992 | Nakagawa et al. |
| 5,111,253 A | 5/1992 | Korman et al. |
| 5,134,448 A | 7/1992 | Johnsen et al. |
| 5,142,640 A | 8/1992 | Iwanatsu |
| 5,156,989 A | 10/1992 | Williams et al. |
| 5,164,325 A | 11/1992 | Cogan et al. |
| 5,164,802 A | 11/1992 | Jones et al. |
| 5,168,331 A | 12/1992 | Yilmaz |
| 5,168,973 A | 12/1992 | Asayama et al. |
| 5,188,973 A | 2/1993 | Omura et al. |
| 5,208,657 A | 5/1993 | Chatterjee et al. |
| 5,216,275 A | 6/1993 | Chen |
| 5,219,777 A | 6/1993 | Kang |
| 5,219,793 A | 6/1993 | Cooper et al. |
| 5,233,215 A | 8/1993 | Baliga |
| 5,242,845 A | 9/1993 | Baba et al. |
| 5,250,450 A | 10/1993 | Lee et al. |
| 5,262,336 A | 11/1993 | Pike, Jr. et al. |
| 5,268,311 A | 12/1993 | Euen et al. |
| 5,275,961 A | 1/1994 | Smayling et al. |
| 5,275,965 A | 1/1994 | Manning |
| 5,281,548 A | 1/1994 | Prall |
| 5,283,201 A | 2/1994 | Tsang et al. |
| 5,294,824 A | 3/1994 | Okada |
| 5,298,781 A | 3/1994 | Cogan et al. |
| 5,300,447 A | 4/1994 | Anderson |
| 5,300,452 A | 4/1994 | Chang et al. |
| 5,326,711 A | 7/1994 | Malhi |
| 5,346,834 A | 9/1994 | Hisamoto et al. |
| 5,350,937 A | 9/1994 | Yamazaki et al. |
| 5,365,102 A | 11/1994 | Mehrotra et al. |
| 5,366,914 A | 11/1994 | Takahashi et al. |
| 5,389,815 A | 2/1995 | Takahashi |
| 5,405,794 A | 4/1995 | Kim |
| 5,418,376 A | 5/1995 | Muraoka et al. |
| 5,424,231 A | 6/1995 | Yang |
| 5,429,977 A | 7/1995 | Lu et al. |
| 5,430,311 A | 7/1995 | Murakami et al. |
| 5,430,324 A | 7/1995 | Bencuya |
| 5,434,435 A | 7/1995 | Baliga |
| 5,436,189 A | 7/1995 | Beasom |
| 5,438,007 A | 8/1995 | Vinal et al. |
| 5,438,215 A | 8/1995 | Tihanyi |
| 5,442,214 A | 8/1995 | Yang |
| 5,473,176 A | 12/1995 | Kakumoto |
| 5,473,180 A | 12/1995 | Ludikhuize |
| 5,474,943 A | 12/1995 | Hshieh et al. |
| 5,488,010 A | 1/1996 | Wong |
| 5,519,245 A | 5/1996 | Tokura et al. |
| 5,532,179 A | 7/1996 | Chang et al. |
| 5,541,425 A | 7/1996 | Nishihara |
| 5,554,552 A | 9/1996 | Chi |
| 5,554,862 A | 9/1996 | Omura et al. |
| 5,567,634 A | 10/1996 | Hebert et al. |
| 5,567,635 A | 10/1996 | Acovic et al. |
| 5,572,048 A | 11/1996 | Sugawara |
| 5,576,245 A | 11/1996 | Cogan et al. |
| 5,578,851 A | 11/1996 | Hshieh et al. |
| 5,581,100 A | 12/1996 | Ajit |
| 5,583,065 A | 12/1996 | Miwa |
| 5,592,005 A | 1/1997 | Floyd et al. |
| 5,593,909 A | 1/1997 | Han et al. |
| 5,595,927 A | 1/1997 | Chen et al. |
| 5,597,765 A | 1/1997 | Yilmaz et al. |
| 5,605,852 A | 2/1997 | Bencuya |
| 5,616,945 A | 4/1997 | Williams |
| 5,623,152 A | 4/1997 | Majumdar et al. |
| 5,629,543 A | 5/1997 | Hshieh et al. |
| 5,637,898 A | 6/1997 | Baliga |
| 5,639,676 A | 6/1997 | Hshieh et al. |
| 5,640,034 A | 6/1997 | Malhi |
| 5,648,670 A | 7/1997 | Blanchard |
| 5,656,843 A | 8/1997 | Goodyear et al. |
| 5,665,619 A | 9/1997 | Kwan et al. |
| 5,670,803 A | 9/1997 | Beilstein, Jr. et al. |
| 5,684,320 A | 11/1997 | Kawashima |
| 5,689,128 A | 11/1997 | Hshieh et al. |
| 5,693,569 A | 12/1997 | Ueno |
| 5,705,409 A | 1/1998 | Witek |
| 5,710,072 A | 1/1998 | Krautschneider et al. |
| 5,714,781 A | 2/1998 | Yamamoto et al. |
| 5,717,237 A | 2/1998 | Chi |
| 5,719,409 A | 2/1998 | Singh et al. |
| 5,744,372 A | 4/1998 | Bulucea |
| 5,767,004 A | 6/1998 | Balasubramanian et al. |
| 5,770,878 A | 6/1998 | Beasom |
| 5,776,813 A | 7/1998 | Huang et al. |
| 5,780,343 A | 7/1998 | Bashir |
| 5,801,417 A | 9/1998 | Tsang et al. |
| 5,814,858 A | 9/1998 | Williams |
| 5,821,583 A | 10/1998 | Hshieh et al. |
| 5,877,528 A | 3/1999 | So |
| 5,879,971 A | 3/1999 | Witek |
| 5,879,994 A | 3/1999 | Kwan et al. |
| 5,894,157 A | 4/1999 | Han et al. |
| 5,895,951 A | 4/1999 | So et al. |
| 5,895,952 A | 4/1999 | Darwish et al. |
| 5,897,343 A | 4/1999 | Mathew et al. |
| 5,897,360 A | 4/1999 | Kawaguchi |
| 5,900,663 A | 5/1999 | Johnson et al. |
| 5,906,680 A | 5/1999 | Meyerson |
| 5,907,776 A | 5/1999 | Hshieh et al. |

| Patent | Date | Inventor |
|---|---|---|
| 5,917,216 A | 6/1999 | Floyd et al. |
| 5,929,481 A | 7/1999 | Hsieh et al. |
| 5,943,581 A | 8/1999 | Lu et al. |
| 5,949,104 A | 9/1999 | D'Anna et al. |
| 5,949,124 A | 9/1999 | Hadizad et al. |
| 5,959,324 A | 9/1999 | Kohyama |
| 5,960,271 A | 9/1999 | Wollesen et al. |
| 5,972,741 A | 10/1999 | Kubo et al. |
| 5,973,360 A | 10/1999 | Tihanyi |
| 5,973,367 A | 10/1999 | Williams |
| 5,976,936 A | 11/1999 | Miyajima et al. |
| 5,977,591 A | 11/1999 | Fratin et al. |
| 5,981,344 A | 11/1999 | Hshieh et al. |
| 5,981,996 A | 11/1999 | Fujishima |
| 5,998,833 A | 12/1999 | Baliga |
| 6,005,271 A | 12/1999 | Hshieh |
| 6,008,097 A | 12/1999 | Yoon et al. |
| 6,011,298 A | 1/2000 | Blanchard |
| 6,015,727 A | 1/2000 | Wanlass |
| 6,020,250 A | 2/2000 | Kenney et al. |
| 6,034,415 A | 3/2000 | Johnson et al. |
| 6,037,202 A | 3/2000 | Witek |
| 6,037,628 A | 3/2000 | Huang |
| 6,037,632 A | 3/2000 | Omura et al. |
| 6,040,600 A | 3/2000 | Uenishi et al. |
| 6,048,772 A | 4/2000 | D'Anna |
| 6,049,108 A | 4/2000 | Williams et al. |
| 6,051,488 A | 4/2000 | Lee et al. |
| 6,057,558 A | 5/2000 | Yamamoto et al. |
| 6,063,678 A | 5/2000 | D'Anna |
| 6,064,088 A | 5/2000 | D'Anna |
| 6,066,878 A | 5/2000 | Neilson |
| 6,069,043 A | 5/2000 | Floyd et al. |
| 6,077,733 A | 6/2000 | Chen et al. |
| 6,081,009 A | 6/2000 | Neilson |
| 6,084,264 A | 7/2000 | Darwish |
| 6,084,268 A | 7/2000 | de Frésart et al. |
| 6,087,232 A | 7/2000 | Kim et al. |
| 6,096,608 A | 8/2000 | Williams |
| 6,097,063 A | 8/2000 | Fujihira |
| 6,103,578 A | 8/2000 | Uenishi et al. |
| 6,103,619 A | 8/2000 | Lai |
| 6,104,054 A | 8/2000 | Corsi et al. |
| 6,110,799 A | 8/2000 | Huang |
| 6,114,727 A | 9/2000 | Ogura et al. |
| 6,137,152 A | 10/2000 | Wu |
| 6,150,697 A | 11/2000 | Teshigahara et al. |
| 6,156,606 A | 12/2000 | Michaelis |
| 6,156,611 A | 12/2000 | Lan et al. |
| 6,163,052 A | 12/2000 | Liu et al. |
| 6,165,870 A | 12/2000 | Shim et al. |
| 6,168,983 B1 | 1/2001 | Rumennik et al. |
| 6,168,996 B1 | 1/2001 | Numazawa et al. |
| 6,171,935 B1 | 1/2001 | Nance et al. |
| 6,174,769 B1 | 1/2001 | Lou |
| 6,174,773 B1 | 1/2001 | Fujishima |
| 6,174,785 B1 | 1/2001 | Parekh et al. |
| 6,184,545 B1 | 2/2001 | Werner et al. |
| 6,184,555 B1 | 2/2001 | Tihanyi et al. |
| 6,188,104 B1 | 2/2001 | Choi et al. |
| 6,188,105 B1 | 2/2001 | Kocon et al. |
| 6,190,978 B1 | 2/2001 | D'Anna |
| 6,191,447 B1 | 2/2001 | Baliga |
| 6,194,741 B1 | 2/2001 | Kinzer et al. |
| 6,198,127 B1 | 3/2001 | Kocon |
| 6,201,279 B1 | 3/2001 | Pfirsch |
| 6,204,097 B1 | 3/2001 | Shen et al. |
| 6,207,484 B1 * | 3/2001 | Kim et al. ................. 438/209 |
| 6,207,994 B1 | 3/2001 | Rumennik et al. |
| 6,222,229 B1 | 4/2001 | Hebert et al. |
| 6,222,233 B1 | 4/2001 | D'Anna |
| 6,225,649 B1 | 5/2001 | Minato |
| 6,228,727 B1 | 5/2001 | Lim et al. |
| 6,239,463 B1 | 5/2001 | Williams et al. |
| 6,239,464 B1 | 5/2001 | Tsuchitani et al. |
| 6,265,269 B1 | 7/2001 | Chen et al. |
| 6,271,082 B1 | 8/2001 | Hou et al. |
| 6,271,100 B1 | 8/2001 | Ballantine et al. |
| 6,271,552 B1 | 8/2001 | D'Anna |
| 6,271,562 B1 | 8/2001 | Deboy et al. |
| 6,274,904 B1 | 8/2001 | Tihanyi |
| 6,274,905 B1 | 8/2001 | Mo |
| 6,277,706 B1 | 8/2001 | Ishikawa |
| 6,281,547 B1 | 8/2001 | So et al. |
| 6,285,060 B1 | 9/2001 | Korec et al. |
| 6,291,298 B1 | 9/2001 | Williams et al. |
| 6,291,856 B1 | 9/2001 | Miyasaka et al. |
| 6,294,818 B1 | 9/2001 | Fujihira |
| 6,297,534 B1 | 10/2001 | Kawaguchi et al. |
| 6,303,969 B1 | 10/2001 | Tan |
| 6,307,246 B1 | 10/2001 | Nitta et al. |
| 6,309,920 B1 | 10/2001 | Laska et al. |
| 6,313,482 B1 | 11/2001 | Baliga |
| 6,316,806 B1 | 11/2001 | Mo |
| 6,326,656 B1 | 12/2001 | Tihanyi |
| 6,337,499 B1 | 1/2002 | Werner |
| 6,346,464 B1 | 2/2002 | Takeda et al. |
| 6,346,469 B1 | 2/2002 | Greer |
| 6,351,018 B1 | 2/2002 | Sapp |
| 6,353,252 B1 | 3/2002 | Yasuhara et al. |
| 6,359,308 B1 | 3/2002 | Hijzen et al. |
| 6,362,112 B1 | 3/2002 | Hamerski |
| 6,362,505 B1 | 3/2002 | Tihanyi |
| 6,365,462 B2 | 4/2002 | Baliga |
| 6,365,930 B1 | 4/2002 | Schillaci et al. |
| 6,368,920 B1 | 4/2002 | Beasom |
| 6,368,921 B1 | 4/2002 | Hijzen et al. |
| 6,376,314 B1 | 4/2002 | Jerred |
| 6,376,315 B1 | 4/2002 | Hshieh et al. |
| 6,376,878 B1 | 4/2002 | Kocon |
| 6,376,890 B1 | 4/2002 | Tihanyi |
| 6,384,456 B1 | 5/2002 | Tihanyi |
| 6,388,286 B1 | 5/2002 | Baliga |
| 6,388,287 B2 | 5/2002 | Deboy et al. |
| 6,400,003 B1 | 6/2002 | Huang |
| 6,426,260 B1 | 7/2002 | Hshieh |
| 6,429,481 B1 | 8/2002 | Mo et al. |
| 6,433,385 B1 | 8/2002 | Kocon et al. |
| 6,436,779 B2 | 8/2002 | Hurkx et al. |
| 6,437,399 B1 | 8/2002 | Huang |
| 6,441,454 B2 | 8/2002 | Hijzen et al. |
| 6,444,574 B1 | 9/2002 | Chu |
| 6,452,230 B1 | 9/2002 | Boden, Jr. |
| 6,461,918 B1 | 10/2002 | Calafut |
| 6,465,304 B1 | 10/2002 | Blanchard et al. |
| 6,465,843 B1 | 10/2002 | Hirler et al. |
| 6,465,869 B2 | 10/2002 | Ahlers et al. |
| 6,472,678 B1 | 10/2002 | Hshieh et al. |
| 6,472,708 B1 | 10/2002 | Hshieh et al. |
| 6,475,884 B2 | 11/2002 | Hshieh et al. |
| 6,476,443 B1 | 11/2002 | Kinzer |
| 6,479,352 B2 | 11/2002 | Blanchard |
| 6,489,652 B1 | 12/2002 | Jeon et al. |
| 6,501,146 B1 | 12/2002 | Harada |
| 6,534,825 B2 | 3/2003 | Calafut |
| 6,566,804 B1 | 5/2003 | Trujillo et al. |
| 6,580,123 B2 | 6/2003 | Thapar |
| 6,608,350 B2 | 8/2003 | Kinzer et al. |
| 6,633,065 B2 * | 10/2003 | Rumennik et al. .......... 257/342 |
| 6,657,254 B2 | 12/2003 | Hshieh et al. |
| 6,677,641 B2 | 1/2004 | Kocon |
| 6,683,346 B2 | 1/2004 | Zeng |
| 6,720,616 B2 | 4/2004 | Hirler et al. |
| 6,734,066 B2 | 5/2004 | Lin et al. |
| 6,762,127 B2 | 7/2004 | Boiteux et al. |
| 6,806,533 B2 | 10/2004 | Henninger et al. |

| | | | |
|---|---|---|---|
| 6,833,584 | B2 | 12/2004 | Henninger et al. |
| 2001/0023961 | A1 | 9/2001 | Hsieh et al. |
| 2001/0026989 | A1 | 10/2001 | Thapar |
| 2001/0028083 | A1 | 10/2001 | Onishi et al. |
| 2001/0032998 | A1 | 10/2001 | Iwamoto et al. |
| 2001/0041400 | A1 | 11/2001 | Ren et al. |
| 2001/0049167 | A1 | 12/2001 | Madson |
| 2001/0050394 | A1 | 12/2001 | Onishi et al. |
| 2002/0008284 | A1 | 1/2002 | Zeng |
| 2002/0009832 | A1 | 1/2002 | Blanchard |
| 2002/0014658 | A1 | 2/2002 | Blanchard |
| 2002/0053685 | A1* | 5/2002 | Pendharkar et al. ........ 257/204 |
| 2002/0066924 | A1 | 6/2002 | Blanchard |
| 2002/0070418 | A1 | 6/2002 | Kinzer et al. |
| 2002/0100933 | A1 | 8/2002 | Marchant |
| 2003/0060013 | A1 | 3/2003 | Marchant |
| 2003/0132540 | A1 | 7/2003 | Minato et al. |
| 2003/0193067 | A1 | 10/2003 | Kim |
| 2003/0209757 | A1 | 11/2003 | Henninger et al. |
| 2004/0031987 | A1 | 2/2004 | Henninger et al. |
| 2004/0089910 | A1 | 5/2004 | Hirler et al. |
| 2004/0121572 | A1 | 6/2004 | Darwish et al. |
| 2004/0232407 | A1 | 11/2004 | Calafut |
| 2005/0017293 | A1 | 1/2005 | Zundel et al. |

FOREIGN PATENT DOCUMENTS

| | | | |
|---|---|---|---|
| EP | 1054451 | A2 | 11/2000 |
| EP | 0747967 | B1 | 2/2002 |
| EP | 1205980 | A1 | 5/2002 |
| JP | 56-058267 | A | 5/1981 |
| JP | 62-069562 | | 3/1987 |
| JP | 63-186475 | * | 8/1988 |
| JP | 63-288047 | | 11/1988 |
| JP | 64-022051 | | 1/1989 |
| JP | 01-192174 | A | 8/1989 |
| JP | 05-226638 | A | 9/1993 |
| JP | 2000-040822 | | 2/2000 |
| JP | 2000-040872 | | 2/2000 |
| JP | 2000-156978 | A | 6/2000 |
| JP | 2000-277726 | A | 10/2000 |
| JP | 2000-277728 | A | 10/2000 |
| JP | 2001-015448 | | 1/2001 |
| JP | 2001-015752 | | 1/2001 |
| JP | 2001-102577 | A | 4/2001 |
| JP | 2001-111041 | A | 4/2001 |
| JP | 2001-135819 | A | 5/2001 |
| JP | 2001-144292 | A | 5/2001 |
| JP | 2001-244461 | A | 9/2001 |
| JP | 2001-313391 | A | 12/2001 |
| JP | 2002-083976 | A | 3/2002 |
| WO | WO 00/33386 | A2 | 6/2000 |
| WO | WO 00/68997 | A1 | 11/2000 |
| WO | WO 00/68998 | A1 | 11/2000 |
| WO | WO 00/75965 | A2 | 12/2000 |
| WO | WO 01/06550 | A1 | 1/2001 |
| WO | WO 01/06557 | A1 | 1/2001 |
| WO | WO 01/45155 | A1 | 6/2001 |
| WO | WO 01/59847 | A2 | 8/2001 |
| WO | WO 01/71815 | | 9/2001 |
| WO | WO 01/95385 | A1 | 12/2001 |
| WO | WO 01/95398 | A1 | 12/2001 |
| WO | WO 02/01644 | A2 | 1/2002 |
| WO | WO 02/47171 | A1 | 6/2002 |

OTHER PUBLICATIONS

Baliga "New Concepts In Power Rectifiers," Physics of Semiconductor Devices, Proceedings of the Third Int'l Workshop, Madras (India), Committee on Science and Technology in Developing Countries (1985), pp. 471-481.

Baliga "Options for CVD of Dielectrics Include Low-k Materials," Technical Literature from Semiconductor International, Jun. 1998, 4 pages total.

Baliga et al., "Improving the reverse recovery of power MOSFET integral diodes by electron irradiation," (Dec. 1983) *Solid State Electronics*, vol. 26, No. 12, pp. 1133-1141.

Brown et al. Novel Trench Gate Structure Developments Set the Benchmark for Next Generation Power MOSFET Switching Peformance. Power Electronics—May 2003 Proceedings (PCIM), Nurenburg, vol. 47, pp. 275-278.

Bulucea "Trench DMOS Transistor Technology For High Current (100 A Range) Switching" Solid-State Electronics vol. 34 No. pp. 493-507 (1991).

Chang et al. "Numerical and experimental Analysis of 500-V Power DMOSFET with an Atomic-Lattice Layout," IEEE Transactions on Electron Devices 36:2623 (1989).

Chang et al. "Self-Aligned UMOSFET's with a Specific On-Resistance of 1mΩ cm²," IEEE Transactions on Electron Devices 34:2329-2334 (1987).

Cheng et al., "Fast reverse recovery body diode in high-voltage VDMOSFET using cell-distributed schottky contacts," (May 2003) *IEEE Transactions on Electron Devices*, vol. 50, No. 5, pp. 1422-1425.

"CoolMOS™ the second generation," Infineon Technologies product information, (2000), 2 pages total.

Curtis, et al. "APCVD TEOS: 03 Advanced Trench Isolation Applications," Semiconductor Fabtech 9th Edition (1999) 8 pages total.

Darwish et al. A New Power W-Gated Trench MOSFET (WMOSFET) with High Switching Performance. ISPSD Proceedings—Apr. 2003, Cambridge, 4 pages total.

Djekic, O. et al., "High frequency synchronous buck converter for low voltage applications," (1998) *Proc. IEEE Power Electronics Specialist Conf. (PESC)*, pp. 1248-1254.

Fujihara "Theory of Semiconductor Superjunction Devices" Jpn. J. Appl. Phys. vol. 36 pp. 6254-6262 (1997).

Gan et al. "Poly Flanked VDMOS (PFVDMOS): A Superior Technology for Superjunction Devices," IEEE Power Electronics Specialists Conference, Jun. 17-22, 2001, Vancouver, Canada (2001), 4 pages total.

Glenn et al. "A Novel Vertical Deep Trench Resurf DMOS (VTR-DMOS)" IEEE ISPD 2000, May 22-25, Toulouse France, pp. 197-200.

"IR develops CoolMOS™ -equivalent technology, positions it at the top of a 3-tiered line of new products for SMPS," International Rectifiers company information available at http://www.irf.com (1999) 3 pages total.

Kao et al. "Two Dimensional Thermal Oxidation of Silicon-I. Experiments,", *IEEE Transactions on Electron Devices*, vol. ED-34, No. 5, May 1987, pp. 1008-1017.

Kao et al. "Two Dimensional Thermal Oxidation of Silicon-II. Modeling Stress Effects in Wet Oxides," *IEEE Transactions on Electron Devices*, vol. ED-35, No. 1, Jan. 1988, pp. 25-37.

Kassakian, J.G. et al., "High-frequency high-density converters for distributed power supply systems," (Apr. 1988) *Proceedings of the IEEE*, vol. 76, No. 4, pp. 362-376.

Korman, C.S. et al., "High performance power DMOSFET with Integrated schottky diode," (1989) *Proc. IEE Power Electronics Specialist Conf. (PESC)*, pp. 176-179.

Lorenz et al., "Cool MOS- An important milestone towards a new power MOSFET generation" Power Conversion pp. 151-160 (1988).

Maksimovic, A.M. et al., "Modeling and simulation of power electronic converters," (Jun. 2001) *Proceedings of the IEEE*, vol. 89, No. 6, pp. 898-912.

Mehrotra, M. et al., "Very low forward drop JBS rectifiers fabricated using submicron technology," (Nov. 1993) *IEEE Transactions on Electron Devices*, vol. 40, No. 11, pp. 2131-2132.

Miller, "Power Management & Supply—Market, Applications Technologies—an Overview," Infineon Technologies, downloaded from the internet <<http://www.ewh.ieee.org/r8/germany/ias-pels/m_regensburg/overview_miller.pdf>>, May 5, 2003, 53 pages total.

Moghadam "Delivering Value Around New Industry Paradigms," Technical Literature from Applied Materials, pp. 1-11, vol. 1, Issue 2, Nov. 1999.

Park et al., "Lateral Trench Gate Super-Junction SOI-LDMOSFETs with Low On-Resistance," Institute for Microelectronics, University of Technology Vienna, Austria (2002), pp. 283-285.

Sakai et al., "Experimental investigation of dependence of electrical characteristics of device parameters in trench MOS barrier, schottky diodes," (1998) *International Symposium on Power Semiconductors and ICs, Technical Digest*, pp. 293-296.

Shenai et al., "Current transport mechanisms in atomically abrupt metal-semiconductor interfaces," (Apr. 1988) *IEEE Transactions on Electron Devices*, vol. 35, No. 4, pp. 468-482.

Shenai et al., "Monolithically integrated power MOSFET and schottky diode with improved reverse recovery characteristics," (Apr. 1990) *IEEE Transactions on Electron Devices*, vol. 37, No. 4, pp. 1167-1169.

Shenoy et al."Analysis of the Effect of Charge Imbalance on the Static and Dynamic Characteristic of the Super Junction MOSFET," IEEE International Symposium on Power Semiconductor Devices 1999, pp. 99-102 (1999).

Singer "Empty Spaces in Silicon (ESS): An Alternative to SOI," Semiconductor International p. 42, Dec. 1999.

Tabisz et al., "A MOSFET resonant synchronous rectifier for high-frequency dc/dc converters," (1990) *Proc. IEEE Power Electronics Specialist Conf.* (PESC), pp. 769-779.

Technical Literature from Quester Technology, Model APT-4300 300mm Atmospheric TEOS/Ozone CVD System, (unknown date), 3 pages total.

Technical Literature from Quester Technology, Model APT-6000 Atmospheric TEOS-Ozone CVD System, (unknown date), 2 pages total.

Technical Literature from Silicon Valley Group Thermal Systems, APNext, High Throughput APCVD Cluster Tool for 200 mm/300 mm Wafer Processing, (unknown date), 2 pages total.

Tu et al. "On the reverse blocking characteristics of schottky power diodes," (Dec. 1992) *IEEE Transactions on Electron Devices*. vol. 39, No. 12, pp. 2813-2814 2 pages total.

Ueda et al. "An Ultra-Low On-Resistance Power MOSFET Fabricated by Using a Fully Self-Aligned Process," IEEE Transactions on Electron Devices 34:926-930 (1987).

Wilamowski "Schottky Diodes with High Breakdown Voltages," Solid-State Electronics 26:491-493 (1983).

Wolf et al., "Silicon Processing for The VLSI Era" vol. 1—Process Technology, Second Edition, (1990), pp. 658.

Wolf, "Silicon Processing for The VLSI Era" vol. 2 Process Integration Lattice Press (1990), 3 pages total.

Yamashita et al., Conduction Power loss in MOSFET synchronous rectifier with parallel-connected schottky barrier diode, (Jul. 1998) *IEEE Transactions on Power electronics*, vol. 13, No. 4, pp. 667-673.

\* cited by examiner

HIGH BREAKDOWN VOLTAGE LOW ON-RESISTANCE LATERAL DMOS TRANSISTOR

CROSS-REFERENCES TO RELATED APPLICATIONS

This application claims priority to Korean patent application number 2002-9731, filed Feb. 23, 2002, which is incorporated herein by reference.

BACKGROUND OF THE INVENTION

The present invention relates in general to a high voltage lateral double diffused metal oxide semiconductor (LDMOS) transistor, and more particularly, to a high voltage LDMOS transistor in which the on-resistance of a transistor is reduced without a reduction in the breakdown voltage.

In order to achieve high switching speed, the on-resistance of the high voltage LDMOS transistor must be low. In general, the on-resistance of the LDMOS transistor is primarily determined by the channel resistance and by the drift region resistance. In the case of high voltage LDMOS transistor, the on-resistance is governed primarily by the drift region resistance. Thus, in order to reduce the on-resistance of the high voltage LDMOS transistor, the drift region resistance must be reduced. To reduce the drift region resistance, the concentration of impurities in the drift region must be increased. However, increasing the concentration of the impurities in the drift region results in lower breakdown voltage. Thus, there is a trade off relation between the on-resistance and the breakdown voltage of the device.

Figure 1:
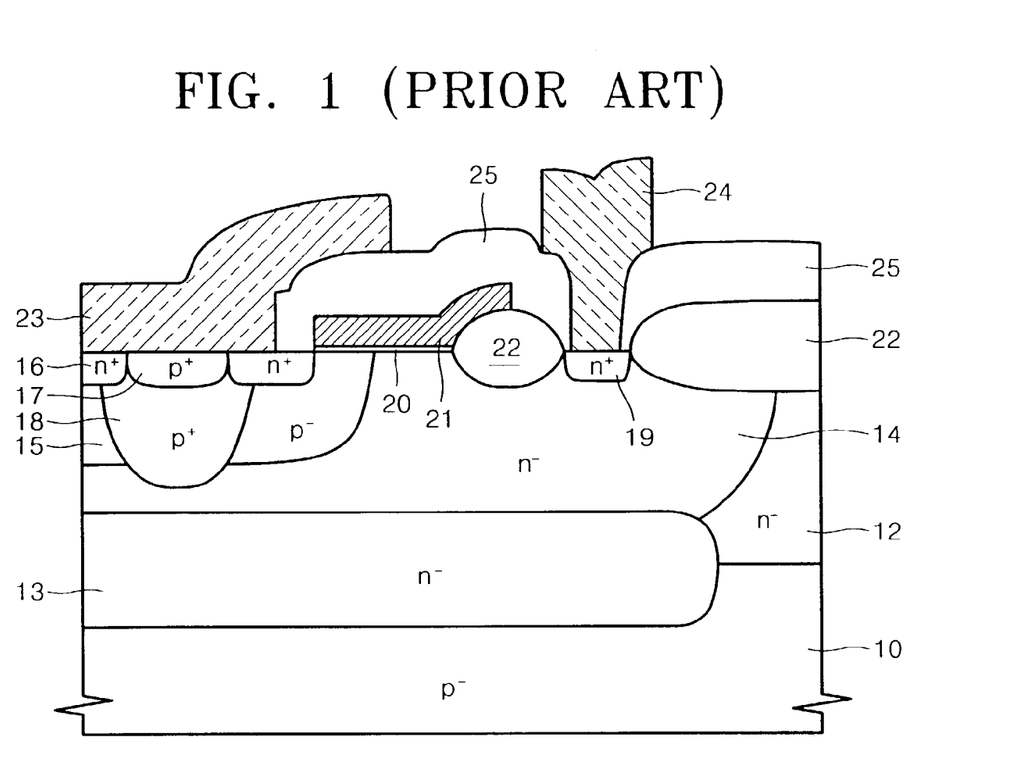
FIG. 1 is a cross-sectional view of a conventional high voltage lateral double diffused metal oxide semiconductor (LDMOS) transistor.

FIG. 1 is a cross-sectional view of a conventional high voltage LDMOS transistor. An n⁻-type epitaxial layer 12 is formed on a p⁻-type substrate 10. An n⁻-type buried layer 13 is extends into both p⁻-type substrate 10 and n⁻-type epitaxial layer 12. An n⁻-type well region 14 is formed in n⁻-type epitaxial layer 12, and extends over n⁻-type buried layer 13. A p⁻-type body region 15 is formed in n⁻-type well region 14. An n⁺-type source region 16 and a p⁺-type body-contact region 17 are formed in p⁻-type body region 15. A p⁺-type region 18 extends from below n⁺-type source region 16 and a p⁺-type body-contact region 17 through p⁻-type body region 15, terminating in n⁻-type well region 14. An n⁺-type drain region 19 is formed in n⁻-type well region 14.

A gate insulating layer 20 extends over n⁻-type well region 14 and a surface portion of p⁻-type body region 15. A gate conductive layer 21 extends over gate insulating layer 20 and an upper portion of a local oxidation of silicon (LOCOS) oxide layer 22. A source electrode 23 is in contact with n⁺-type source region 16 and p⁺-type source contact region 17, and a drain electrode 24 is in contact with n⁺-type drain region 19. Gate conductive layer 21, source electrode 23, and drain electrode 24 are electrically isolated from one another by an interlayer dielectric (ILD) film 25.

Figure 2:
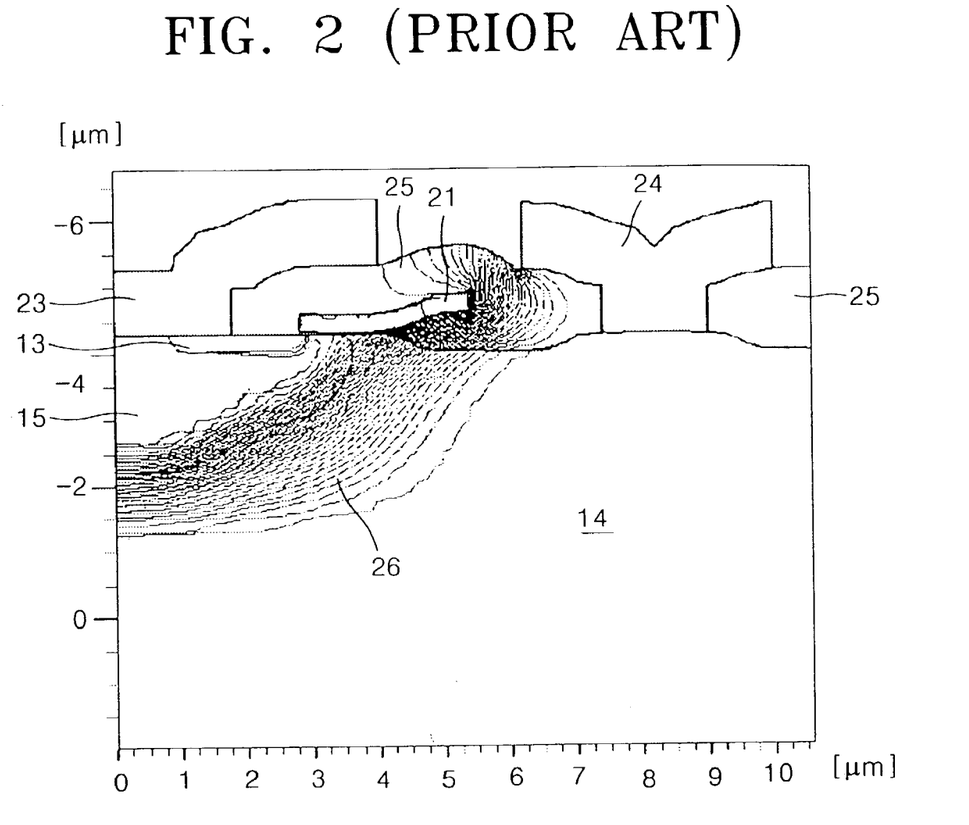
FIG. 2 shows the electric field profile in the high voltage LDMOS transistor of FIG. 1.

FIG. 2 shows the electric field profile in the high voltage LDMOS transistor of FIG. 1 when a reverse bias is applied across the drain-source terminals. Same reference numerals as those in FIG. 1 denote same regions or layers. Upon applying a reverse bias across the drain-source electrodes, a depletion region extends out from the junction between p⁻-type body region 15 and n⁻-type well region 14, and electric field potential lines 26 are formed in the depletion region. If the depletion region extends out beyond a critical limit, breakdown occurs. If the concentration of impurities in n⁻-type well region 14 is increased in order to obtain a lower on-resistance, the depletion region reaches the critical limit at lower drainsource voltages. That is, breakdown occurs with lower electric field intensity, and thus the transistor breakdown voltage is reduced.

Thus, a LDMOS transistor wherein the on-resistance can be reduced without adversely impacting the breakdown voltage is desirable.

SUMMARY OF THE INVENTION

In accordance with the present invention, a metal oxide semiconductor (MOS) transistor has a substrate of a first conductivity type. A drift region of a second conductivity type extends over the substrate. A body region of the first conductivity type is in the drift region. A source region of the second conductivity is in the body region. A gate extends over a surface portion of the body region. The surface portion of the body region extends between the source region and the drift region to form a channel region of the transistor. A drain region of the second conductivity type is in the drift region. The drain region is laterally spaced from the body region. A first buried layer of the second conductivity type is between the substrate and drift region. The first buried layer laterally extends from under the body region to under the drain region. A second buried layer of the first conductivity type is between the first buried layer and the drift region. The second buried layer laterally extends from under the body region to under the drain region.

In one embodiment, an epitaxial layer of a second conductivity type extends over the substrate, and the drift region is formed in the epitaxial layer.

In another embodiment, a body-contact region of the first conductivity type is in the body region.

In another embodiment, a deep region of the first conductivity type vertically extends from under the source and body-contact regions through the drift region and terminates in the second buried layer.

In another embodiment, a field oxide is between the body and drain regions, and the gate extends over a portion of the field oxide.

In accordance with another embodiment of the invention, a method of forming a metal oxide semiconductor (MOS) transistor is as follows. A substrate of a first conductivity is provided. A first buried layer of a second conductivity type is formed over the substrate. A second buried layer of the first conductivity type is formed in the first buried layer. An epitaxial layer of the second conductivity type is formed over the substrate. A drift region of a second conductivity type is formed in the epitaxial layer. A gate layer is formed over the drift region. A body region of the first conductivity type is formed in the drift region such that the gate overlaps a surface portion of the body region. A source region of the second conductivity is formed in the body region. A drain region of the second conductivity type is formed in the drift region. The drain region is laterally spaced from the body region. The first and second buried layers laterally extend from under the body region to under the drain region. The surface portion of the body region extends between the source region and the drift region to form a channel region of the transistor.

In one embodiment, a body-contact region of the first conductivity type is formed in the body region. A deep region of the first conductivity type vertically extends from under the source and body-contact regions through the drift region and terminates in the second buried layer.

In another embodiment, a field oxide is formed between the body and drain regions. The gate extends over a portion of the field oxide.

A further understanding of the nature and advantages of the inventions herein may be realized by reference to the remaining portions of the specification and the attached drawings.

DETAILED DESCRIPTION OF THE INVENTION

In accordance with the invention, a lateral double diffused metal oxide semiconductor (LDMOS) transistor and method of forming the same are disclosed which achieve a low on-resistance without any degradation of the breakdown voltage.

Figure 3:
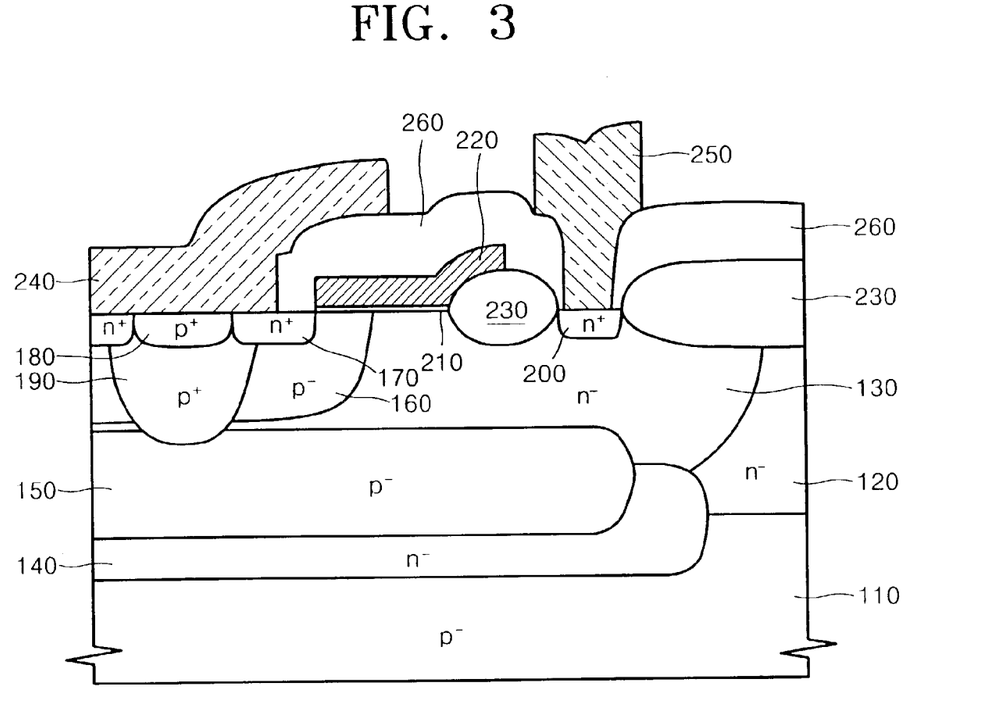
FIG. 3 is a cross-sectional view of a high voltage LDMOS transistor according to the present invention.

FIG. 3 is a cross-sectional view of a high voltage LDMOS transistor according to the present invention. An $n^-$-type epitaxial layer 120 is formed on a $p^-$-type substrate 110. An $n^-$-type well region 130 serving as the drift region is formed in $n^-$-type epitaxial layer 120. An $n^-$-type buried layer 140 extends into $p^-$-type substrate 110 and partially into $n^-$-type epitaxial layer 120 as shown. A p-type buried layer 150 extends into $n^-$-type buried layer 140 and $n^-$-type epitaxial layer 120 as shown. $N^-$-type buried layer 140 forms a junction along its bottom with $p^-$-type substrate 110 and $p^-$-type buried layer 150 forms a junction along its top with $n^-$-type well region 130. $P^-$-type buried layer 150 serves as a reduced surface electric field (RESURF) layer.

A $p^-$-type body region 160 is formed in a predetermined upper region of $n^-$-type well region 130. An $n^+$-type source region 170 and a $p^+$-type body-contact region 180 are formed in $p^-$-type body region 160 adjacent to each other. A $p^+$-type region 190 extends from below $n^+$-type source region 170 and $p^+$-type body-contact region 180 through $p^-$-type body region 160, terminating in $p^-$-type buried layer 150. An $n^+$-type drain region 200 is formed in a predetermined upper portion of $n^-$-type well region 130, and is laterally spaced from $p^-$-type body region 160 a predetermined distance.

A gate insulating layer 210 extends over $n^-$-type well region 130 and a surface portion of $p^-$-type body region 160. A gate conductive layer 220 extends over gate insulating layer 210 and an upper portion of a local oxidation of silicon (LOCOS) field oxide layer 230. A source electrode 240 contacts $n^+$-type source region 170 and $p^+$-type body-contact region 180, and a drain electrode 250 contacts $n^+$-type drain region 200. Gate conductive layer 220, source electrode 240, and drain electrode 250 are electrically isolated from one another by an interlayer dielectric (ILD) film 260.

Figure 4:
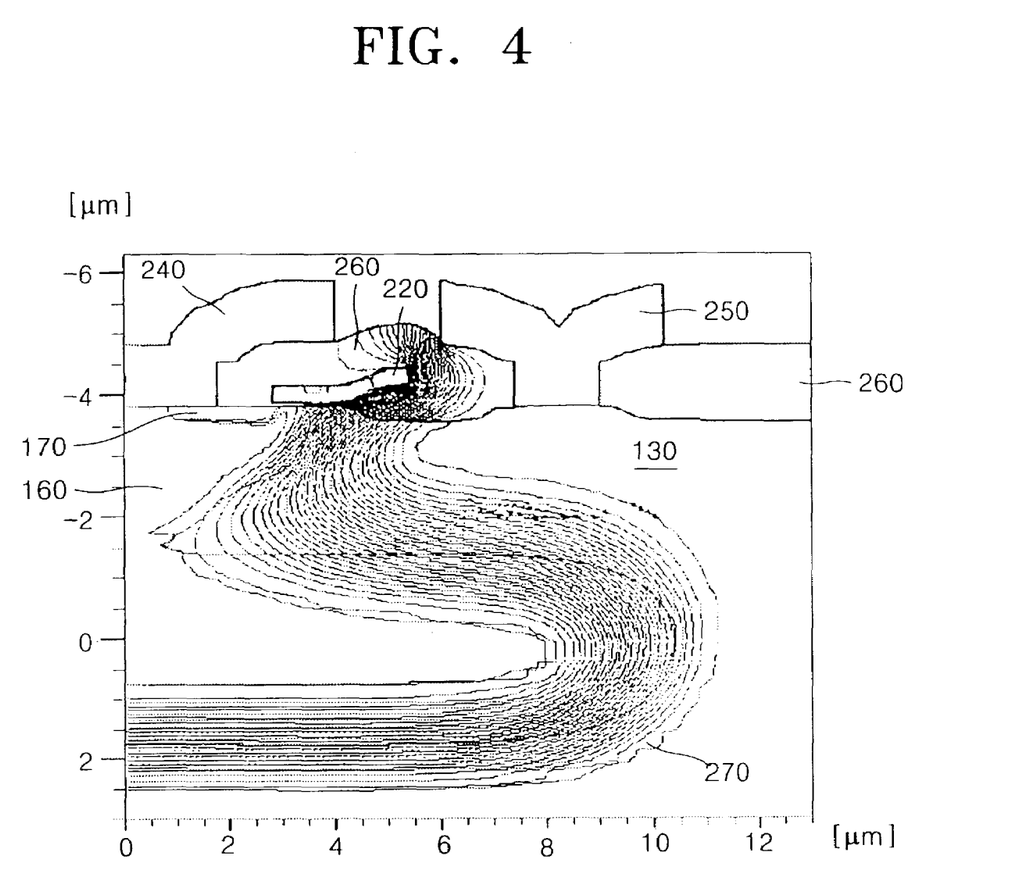
FIG. 4 is shows the electric filed profile in the high voltage LDMOS transistor of FIG. 3.

FIG. 4 shows the electric filed profile in the high voltage LDMOS transistor of FIG. 3 when a reverse bias is applied across the drain-source terminals. In FIG. 4, same reference numerals as those in FIG. 3 denote same regions or layers. here a reverse bias is applied to the drain electrode 250, a depletion region begins to be extended from a junction portion with the $p^-$-type body region 160 and the $n^-$-type well region 130 in both directions, and simultaneously, begins to be extended also from a junction portion with the $n^-$-type well region 130 and the p-type buried layer 150 in both directions. Electric field potential lines 270 are formed in the depletion region. In such a case, when the extension of the depletion region in a device reaches the limit, the device is in a breakdown state. In this case, the depletion region is extended from the junction portion with the $p^-$-type body region 160 and the $n^-$-type well region 130, and simultaneously, from the junction portion with the $n^-$-type well region 130 and the p-type buried layer 150, and thus, the electric potential lines 270 are distributed around the p-type buried layer 150. Thus, a time of the breakdown state is delayed. As a result, the electric potential lines 270 are distributed in wider range, and thereby the size of the breakdown voltage, which may be reduced by increasing the concentration of impurities of the $n^-$-type well region 130 that is used as a drift region so as to reduced the on-resistance of the device, can be compensated. Thus, the on-resistance of the device can be reduced without decrease in the breakdown voltage.

Figure 5:
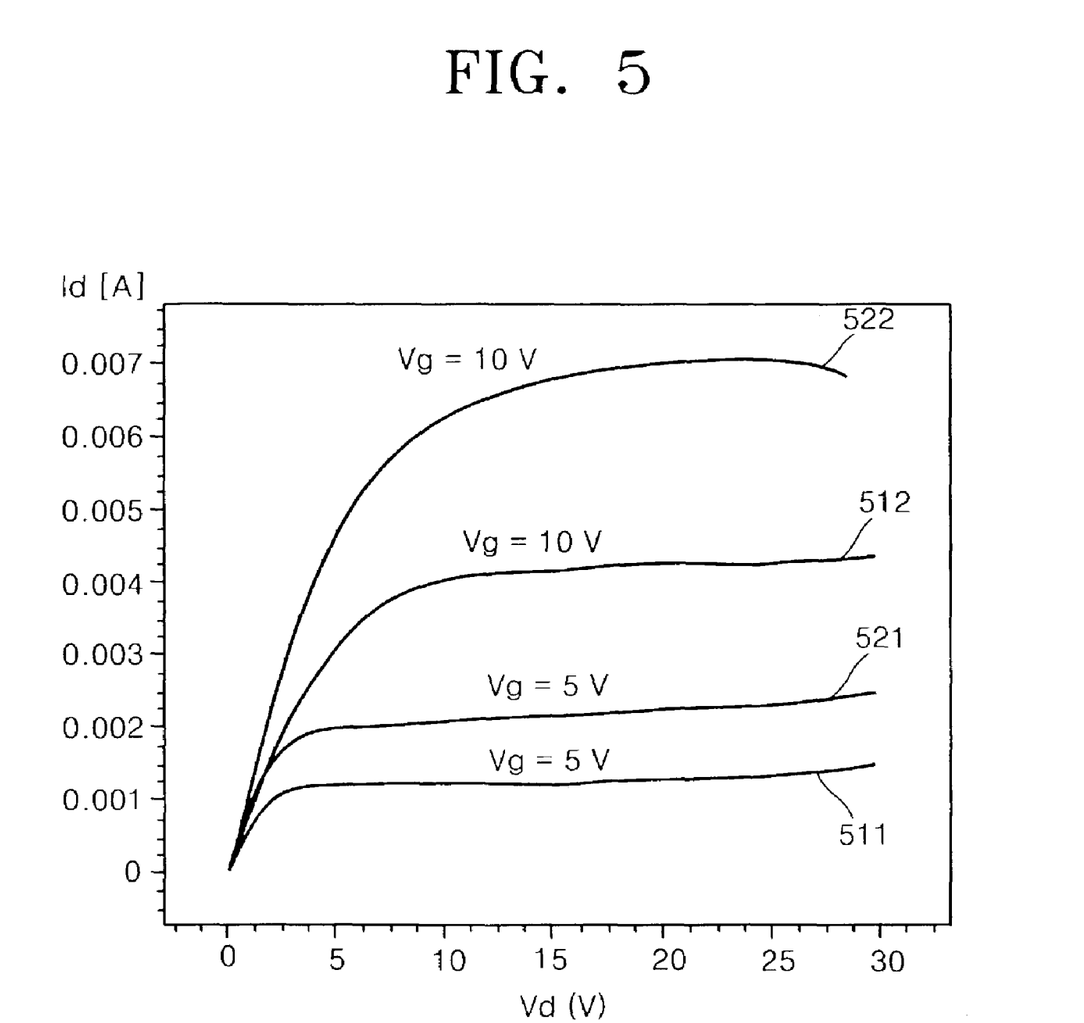
FIG. 5 is a graph comparing the drain current Id versus drain voltage Vd characteristics of the high voltage LDMOS transistor of FIG. 3 to that of the conventional high voltage LDMOS transistor of FIG. 1.

FIG. 5 is a graph comparing the drain current Id versus drain voltage Vd characteristics of the high voltage LDMOS transistor of FIG. 3 (curves 521, 522) to that of the conventional high voltage LDMOS transistor of FIG. 1 (curves 511, 512). As shown by curves 511 and 521, for gate voltage Vg of 5V, the LDMOS transistor of FIG. 3 (curve 521) conducts about twice the amount of drain current Id that the conventional LDMOS transistor of FIG. 1 conducts for drain voltages greater than about 4V. As shown by curves 512 and 522, for gate voltage Vg of 10V, the LDMOS transistor of FIG. 3 (curve 522) also conducts a substantially greater amount of drain current Id than the conventional LDMOS transistor of FIG. 1.

Figure 6:
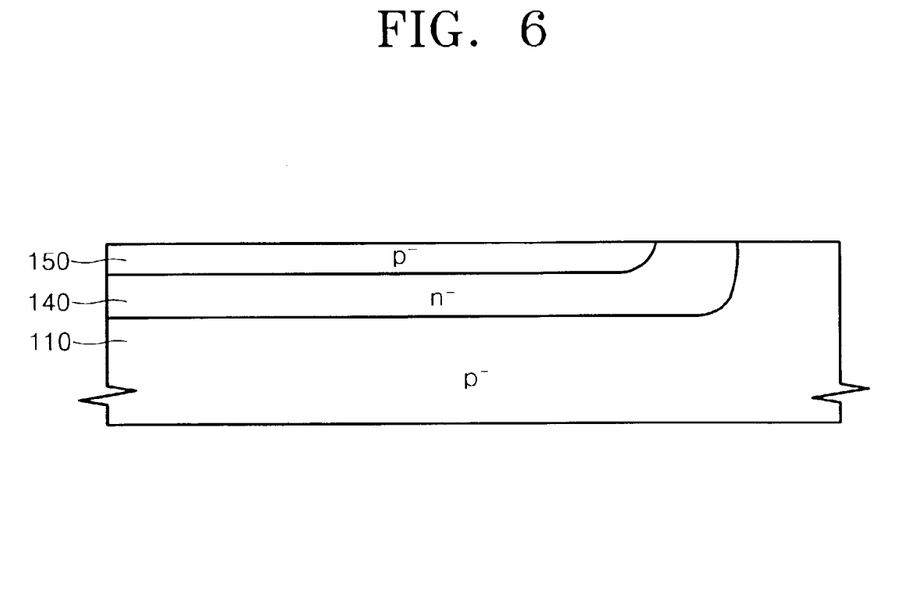
FIGS. 6 through 11 are cross-sectional views illustrating a method for manufacturing the high voltage LDMOS transistor according to the present invention.

FIGS. 6 through 11 are cross-sectional views illustrating a method for manufacturing the high voltage LDMOS transistor according to the present invention. Referring to FIG. 6, $n^-$-type buried layer 140 is formed in an upper portion of $p^-$-type semiconductor substrate 110 by first implanting n-type impurity ions through a mask layer (not shown), and then conducting a drive-in diffusion process. Next, $p^-$-type buried layer 150 is formed in an upper portion of $n^-$-type buried layer 140 by first implanting p-type impurity ions through a mask layer (not shown), and then conducting a drive-in diffusion process.

Figure 7:
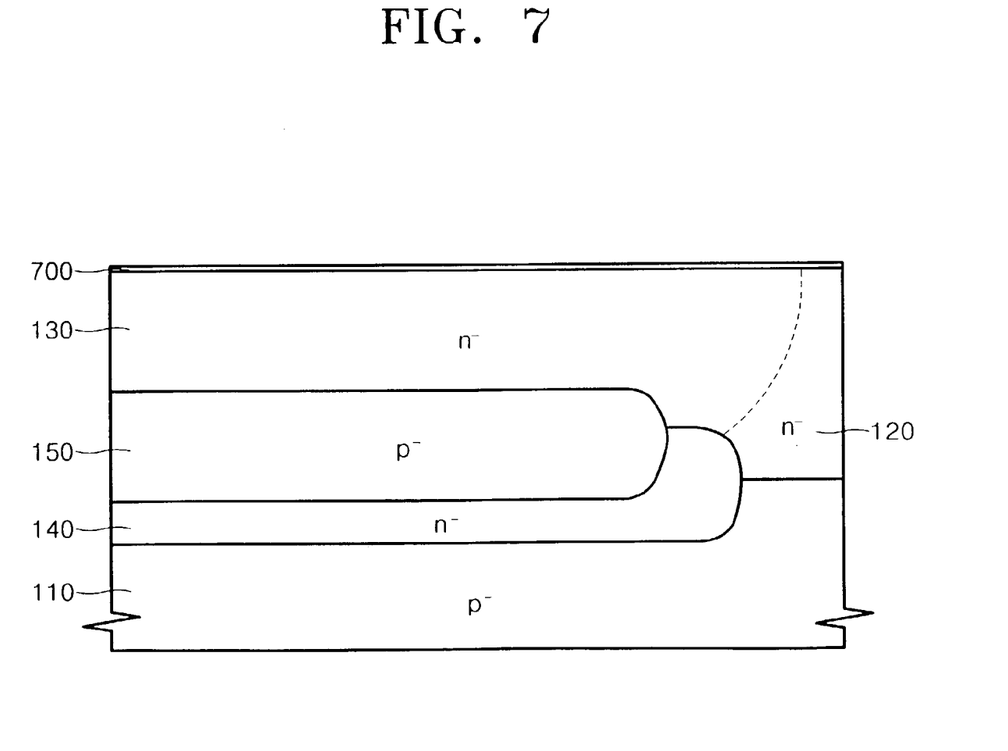

Referring to FIG. 7, $n^-$-type epitaxial layer 120 is grown on the $p^-$-type semiconductor substrate 110. A pad oxide layer 700 is formed on the $n^-$-type epitaxial layer 120. $N^-$-type well region 130 is formed in $n^-$-type epitaxial layer 120 by first implanting n-type impurity ions through a mask layer (not shown), and then conducting a drive-in diffusion process. $N^-$-type well region 130 serves as the drift region.

Figure 8:
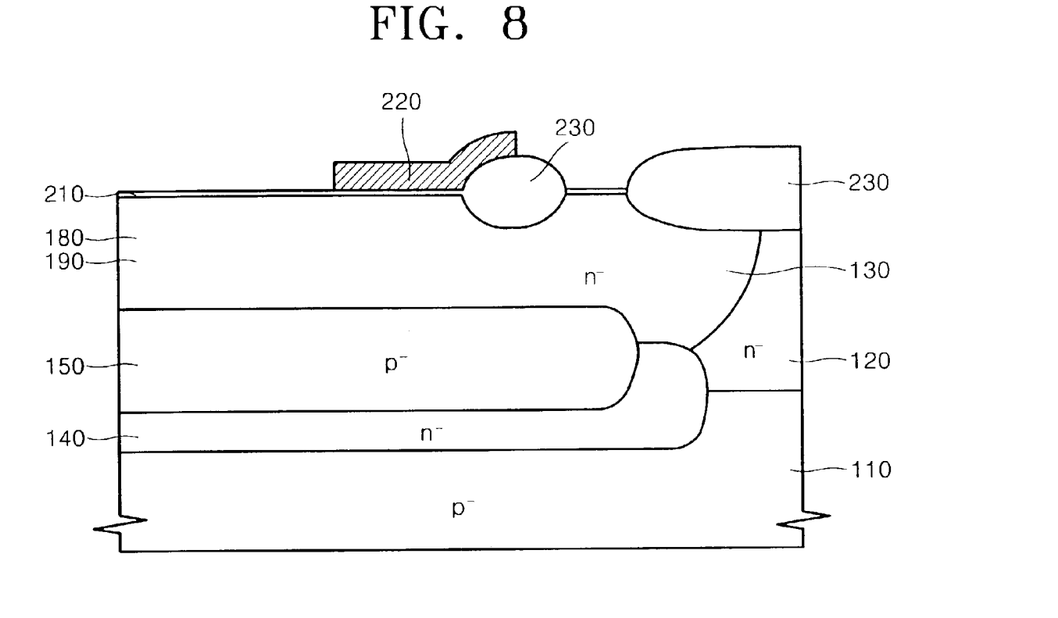

Referring to FIG. 8, a field oxide layer 230 is formed in $n^-$-type well region 130 as shown. In order to form field oxide layer 230, pad oxide layer 700 is removed, and then a thermal oxide layer (not shown) is formed. A nitride layer pattern (not shown) is formed on the thermal oxide layer, and then field oxide layer 230 is formed by performing an oxidation process in which the nitride layer pattern is used as an oxidation-suppressing layer. After field oxide layer 230 is formed, the nitride layer pattern and the thermal oxide layer are removed. Next, gate insulating layer 210 is formed on n⁻-type well region 130. A gate conductive layer is then formed on the gate insulating layer 210 using a mask layer (not shown). As shown gate conductive layer 220 is formed to also extend over a portion of field oxide layer 230.

Figure 9:
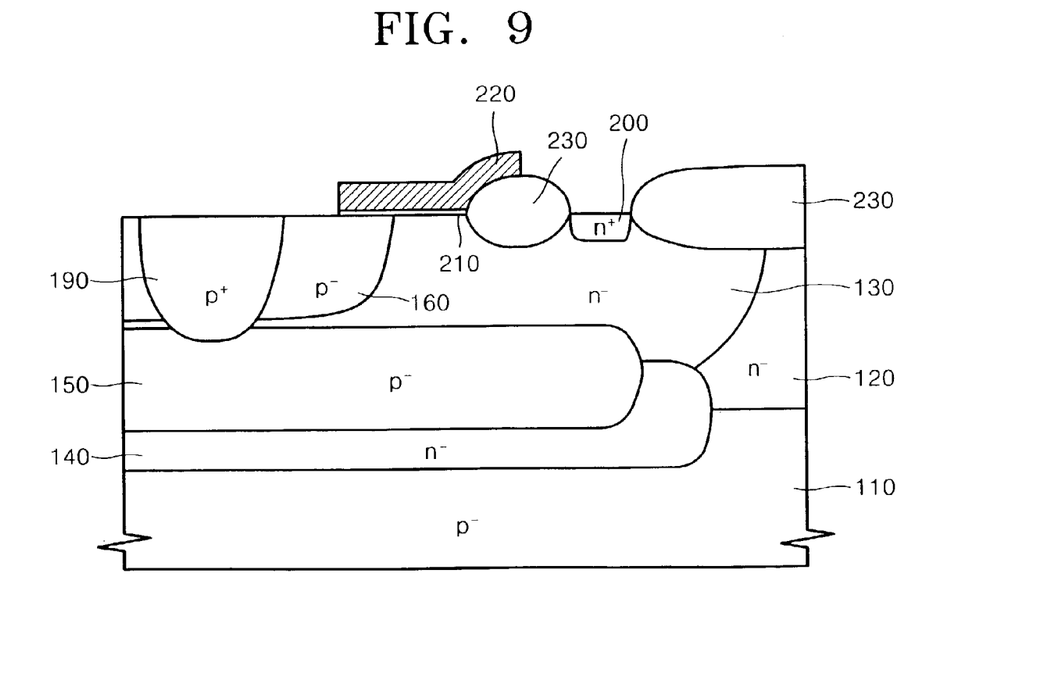

Referring to FIG. 9, p⁺-type region 190 is formed by first implanting p-type impurity ions through a mask layer (not shown), and then conducting a drive-in diffusion process. As shown, p⁺-type region 190 is formed such that it extends vertically through n⁻-type well region 130 and terminates in p⁻-type buried layer 150. Next, p⁻-type body region 160 is formed in n⁻-type well region 130 by first implanting p-type impurity ions through a mask layer (not shown), and then conducting a drive-in diffusion process.

Figure 10:
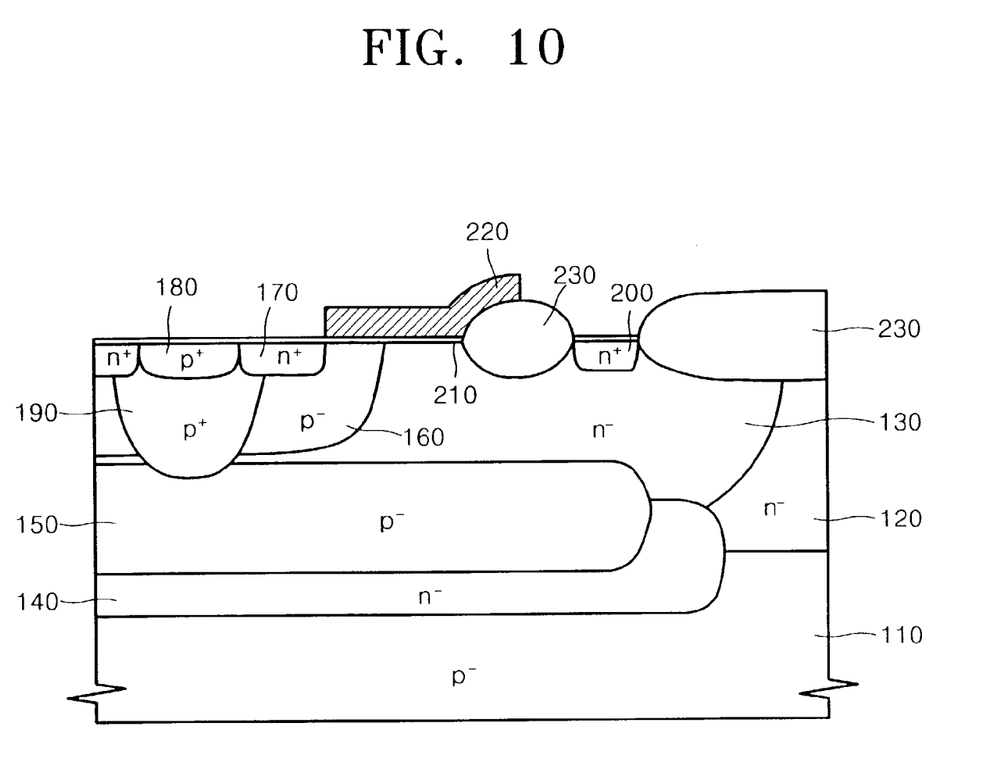

Referring to FIG. 10, n+-type source and drain regions 170, 200 are formed by first implanting n-type impurity ions into an upper portion of each of p⁻-type body region 160 and n⁻-type well region 130 respectively by using an ion implantation mask layer (not shown) and gate conductive layer 122 as masks, and then diffusing the implanted impurities into the respective regions using the drive-in diffusion process. Next, p⁺-type body-contact region 180 is formed in p⁺-type region 190 by first implanting p-type impurity ions through a mask layer (not shown), and then conducting a drive-in diffusion process.

Figure 11:
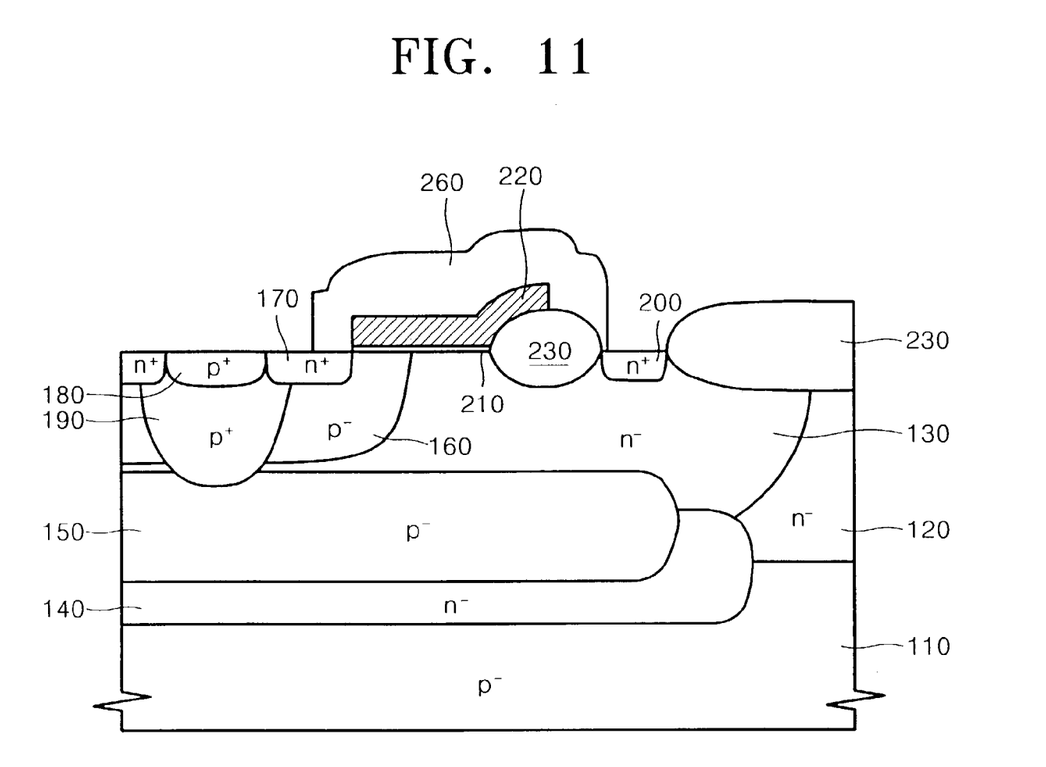

Referring to FIG. 11, interlayer dielectric film 260 is selectively formed on the surface of the structure using a mask layer (not shown). Interlayer dielectric film 260 may be from BPSG. Next, a metal layer is formed and patterned, thereby forming the source electrode (240 in FIG. 3) and the drain electrode (250 in FIG. 3). Interlayer dielectric film 260 serves to electrically isolate gate 220, drain electrode 250, and source electrode 240 from one another.

As described above, in the high voltage LDMOS transistor according to the present invention, p⁻-type buried layer 150 is formed as the RESURF layer between n⁻-type buried layer 140 and n⁻-type well region 130. Thus, when a reverse bias is applied to the drain-source electrodes, the electric potential lines are widely redistributed around p⁻-type buried layer 150. This results in a higher breakdown voltage thus enabling the impurity concentration in n⁻-type well region 130 to be increased in order to reduce the on-resistance of the transistor.

It is to be understood that the different regions shown in the figures are not to scale and are intended to be illustrative only. For example, although n⁻-type buried layer 140 is shown in FIG. 9 to extend symmetrically into each of p⁻-type substrate and n⁻-type epitaxial layer, in practice, n⁻-type buried layer 140 may extend deeper into one adjacent region than the other.

Although the invention has been described in terms of a specific process and structure, it will be obvious to those skilled in the art that many modifications and alterations may be made to the disclosed embodiment without departing from the invention. For example, one of skill in the art would understand that one could begin with a p-type substrate to manufacture a p-channel lateral DMOS transistor, which has silicon layers with complementary doping relative to the n-channel lateral DMOS transistor shown in FIG. 3. Hence, these modifications and alterations are intended to be within the spirit and scope of the invention as defined by the appended claims.

What is claimed is:

1. A metal oxide semiconductor (MOS) transistor comprising:
    a substrate of a first conductivity type;
    a drift region of a second conductivity type over the substrate;
    a body region of the first conductivity type in the drift region;
    a source region of the second conductivity type in the body region;
    a gate extending over a surface portion of the body region, the surface portion of the body region extending between the source region and the drift region to form a channel region of the transistor;
    a drain region of the second conductivity type in the drift region, the drain region being laterally spaced from the body region;
    a first buried layer of the second conductivity type between the substrate and drift region, the first buried layer laterally extending from under the body region to under the drain region; and
    a second buried layer of the first conductivity type laterally extending from under the body region to under the drain region and not beyond the first buried layer, wherein directly under the body region, the second buried layer is between the first buried layer and the body region.

2. The MOS transistor of claim 1 further comprising an epitaxial layer of a second conductivity type over the substrate, the drift region being formed in the epitaxial layer.

3. The MOS transistor of claim 1 further comprising:
    a body-contact region of the first conductivity type in the body region; and
    a deep region of the first conductivity type vertically extending from under the source and body-contact regions through the drift region and terminating in the second buried layer.

4. The MOS transistor of claim 1 further comprising a field oxide between the body and drain regions, the gate extending over a portion of the field oxide.

5. The MOS transistor of claim 4 wherein the field oxide is adjacent the drain region but is laterally spaced from the body region.

6. The MOS transistor of claim 1 wherein the first buried layer forms a junction with each of the substrate, the drift region, and the second buried layer.

7. The MOS transistor of claim 1 wherein the second buried layer forms a junction with each of the first buried layer and the drift region.

8. The MOS transistor of claim 1 further comprising:
    a drain electrode contacting the drain region;
    a source electrode contacting the source region; and
    an interlayer dielectric layer electrically isolating the gate, the source electrode, and the drain electrode from one another.

9. The MOS transistor of claim 1 wherein the first conductivity type is p-type and the second conductivity type is n-type.

10. The MOS transistor of claim 1 wherein the deep region and the body-contact region have a higher doping concentration than the body layer and the second buried layer.

11. The MOS transistor of claim 1 wherein the drain and source regions have a higher doping concentration than the drift region and the first buried layer.

12. A metal oxide semiconductor (MOS) transistor comprising:
- a substrate of a first conductivity type;
- drift region of a second conductivity type over the substrate;
- a body region of the first conductivity type in the drift region;
- a source region of the second conductivity type in the body region;
- a gate extending over a surface portion of the body region, the surface portion of the body region extending between the source region and the drift region to form a channel region of the transistor;
- a drain region of the second conductivity type in the drift region, the drain region being laterally spaced from the body region;
- a first buried layer of the second conductivity type between the substrate and drift region, the first buried layer laterally extending at least from directly under the body region to under the drain region; and
- a second buried layer of the first conductivity type laterally extending at least from directly under the body region to under the drain region, the second buried layer between the first buried layer and the body region directly under the body region.

13. The MOS-gated transistor of claim 12 wherein the first conductivity type is p-type and the second conductivity type is n-type.

14. The MOS-gated transistor of claim 12 wherein the first conductivity type is n-type and the second conductivity type is p-type.

15. The MOS-gated transistor of claim 12 further comprising an epitaxial layer of a second conductivity type over the substrate, a well region being formed in the epitaxial layer.

16. The MOS-gated transistor of claim 12 wherein the first buried layer forms a junction with each of the substrate, a well region, and the second buried layer.

17. The MOS-gated transistor of claim 12 wherein the second buried layer forms a junction with each of the first buried layer and a well region.

18. The MOS-gated transistor of claim 12 further comprising a body contact region of the first conductivity type in the body region.

19. The MOS-gated transistor of claim 12 further comprising a sinker region of the first conductivity type extending from a body contact region to the second buried layer.

* * * * *